US006915252B1

United States Patent
Li (10) Patent No.: US 6,915,252 B1
(45) Date of Patent: Jul. 5, 2005

(54) METHOD AND SYSTEM FOR ENSURING CONSISTENCY OF DESIGN RULE APPLICATION IN A CAD ENVIRONMENT

(75) Inventor: Mu-Jing Li, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/481,246

(22) Filed: Jan. 11, 2000

(51) Int. Cl.$^7$ .............................................. G06F 9/45
(52) U.S. Cl. ................ 703/22; 703/1; 703/2; 716/5; 716/10; 716/18
(58) Field of Search ................ 703/1, 2, 22; 716/10, 716/18, 5

(56) References Cited

U.S. PATENT DOCUMENTS

| | | | | |
|---|---|---|---|---|
| 5,050,091 A | * | 9/1991 | Rubin ........................ | 716/10 |
| 5,548,698 A | * | 8/1996 | Smith et al. ................ | 345/660 |
| 5,552,995 A | * | 9/1996 | Sebastian .................... | 700/97 |
| 5,581,475 A | * | 12/1996 | Majors ........................ | 716/10 |
| 5,681,674 A | * | 10/1997 | Fujimoto ..................... | 430/5 |
| 6,216,252 B1 | * | 4/2001 | Dangelo et al. ............. | 716/1 |

OTHER PUBLICATIONS

Barnes, "SKILL: A CAD System Extension Language", Conference Proceedings on 27th ACM/IEEE Design Automation Conference, 1990, pp. 266–271.*

* cited by examiner

Primary Examiner—Jean R. Homere
Assistant Examiner—Herng-der Day
(74) Attorney, Agent, or Firm—Kudirka & Jobse, LLP (57) ABSTRACT

In a computer-aided design environment, a method for ensuring consistency of design rule application among a plurality of CAD tool programs contemplates the use of a global design rule definition file containing one or more global variables each having a specific design rule characteristic assigned thereto. The values of the global variables are passed to CAD tool programs within the environment directly or indirectly through a technology file which contains a subset of the design rules. Each time a CAD tool session is initialized, the current set of design rules are updated through the use of the technology file and the global design rule definition file. Subsequent modifications or changes of the design rules requires only changing the global design rule definition file to ensure synchronization of design rule application among the various CAD tools in the environment.

11 Claims, 5 Drawing Sheets

METHOD AND SYSTEM FOR ENSURING CONSISTENCY OF DESIGN RULE APPLICATION IN A CAD ENVIRONMENT

FIELD OF THE INVENTION

This invention relates generally to Computer Aided Design (CAD) tools, and, more particularly, to a method and system for ensuring consistency of design rules in a CAD environment.

BACKGROUND OF THE INVENTION

Computer aided design tools are utilized on a wide scale in many research and development environments to design electrical, mechanical, chemical and/or other types of products. In the field of semiconductor design, such CAD tools help designers implement complex circuit architectures into a semiconductor products. Such CAD tools are used for system level design, custom integrated circuit design tools, deep submicron design, logic design and verification, and PCB, package and interconnect design. A popular set of CAD tools, referred to as the Opus CAD design environment, is commercially available from Cadence Design Systems, Inc. of San Jose, Calif. In the Opus CAD design environment, the physical design of an integrated circuit depends on a set of design rules. The design rules are often determined inherently from the type of semiconductor fabrication technology, e.g., CMOS, NMOS, PMOS, etc. which is being utilized to implement the integrated circuit. Design rules typically define physical parameters and relationships such as minimum area, diagonal width, diagonal space, etc., of a physical entity in an integrated circuit. Throughout the development and design of an integrated circuit, such design rules are referenced directly and indirectly by both commercial CAD design tools and custom designed tools developed in-house by the designers. Such custom designed tools may be used to create designs, check designs for rule violations, or to preprocess/post process a design to/from other design tools. A subset of all the design rules in the Opus environment are stored in an internal file referred to as a "technology" file. The technology file is used internally by the Opus CAD tool products.

In an Opus design environment, custom designed CAD tools may be written in the SKILL programming language. The SKILL programming language is a high level language with primitives and operators specifically designed for CAD related tasks. Traditionally, custom CAD tools have been written to contain hard-coded numbers which comply with the design rule parameters for a particular technology. Subsequent changes in design rules, e.g. a change in a minimum width from a value of 0.30 to a value of 0.36, requires that all custom CAD tools likewise be updated accordingly. A custom designed CAD tool, however, may have the same numeric value hard coded multiple times within the tool, not all of which are associated with the design rule parameter to be updated. Accordingly the task of updating design rules becomes time consuming and is prone to errors. In addition, if a large number of custom CAD tools are utilized by the circuit designers, as is common, the task of maintaining all custom CAD tools in synchronization with the current set of design rules becomes even more impractical. Further, errors are propagated when the results of one custom designed CAD tool utilizes the results of other custom CAD tool which was not updated or updated erroneously. In addition, many custom CAD tools must be essentially rewritten when extensive design rule changes occurs, such as with implementation of a design with a different technology.

Accordingly, a need exists for a technique in which CAD tools in a design environment may be synchronized and updated efficiently with a current set of design rules.

An additional need exists for a technique in which SKILL program tools may be synchronized with one or more design rules in an Opus CAD environment through.

SUMMARY OF THE INVENTION

According to the present invention, a technique in which CAD tool programs in a CAD design environment may be synchronized and updated efficiently with a current set of design rules is disclosed. The technique contemplates use of a global design rule definition file having a plurality of global variables each assigned a characteristic value of a design rule. CAD tool programs which utilize the global variables in their program statements indirectly reference the global design rule definition file through a technology file to which the CAD tool programs are initialized. When a design rule change occurs, only the global design rule definition file needs to be modified. The CAD tool programs are automatically updated to the new design rule changes.

According to one aspect of the invention, in a computer-aided design environment, a method for ensuring consistency of design rule application among a plurality of CAD tool programs, each design rule defining a design characteristic, comprises: (a) creating a global design rule definition file comprising at least one global variable having a design rule characteristic assigned thereto; (b) providing a technology file containing a reference to the global variable; (c) initializing one of the CAD tool programs which utilizes the global variable with the technology file reference to the global variable; and (d) conforming the CAD tool program to modifications in the design rule. In one embodiment of the invention, the method further comprises redefining the value of the global variable in the global design rule definition file in accordance with modifications to the design rule. In another embodiment of the invention, the method further comprises determining whether any modifications have occurred.

According to another aspect of the invention, a system for ensuring consistency of design rule application among a plurality of CAD tool programs comprises: (a) a global design rule definition file including at least one global variable having a design rule characteristic assigned thereto; (b) a technology file containing a reference to the global variable; (c) at least one CAD tool programs which utilizes the global variable; and (d) means for ensuring that the CAD tool program utilizes the current design rule changes. In one embodiment of the invention, the means for ensuring comprises means for initializing the CAD tool program which utilizes the global variable with the technology file reference to the global variable.

According to another aspect of the invention, a computer program product for use with a computer system comprises a computer usable medium having program code embodied in the medium, the program code comprising (a) program code for defining in a global design rule definition file at least one global variable having a design rule characteristic assigned thereto; (b) program code defining a technology file containing a reference to the global variable; (c) program code for initializing one of the CAD tool programs which utilizes the global variable with the technology file reference to the global variable; and (d) program code for redefining the value of the global variable in the CAD tool program in accordance with modifications to the design rule characteristic assigned to the global variable in the global design rule definition file.

According to a further aspect of the invention, a computer program product for use with a computer system comprises a computer usable medium having program code embodied in the medium, the program code comprising: (a) program code for performing a computer-aided design function with a value of a global variable representing a design rule characteristic; (b) program code for referencing the value of the global variable in a technology file; and (c) program code for utilizing the value of the global variable received from the technology file to perform the computer-aided design function.

According to yet another aspect of the invention, a computer data signal embodied in a carrier wave comprises: (a) program code for performing a computer-aided design function with a value of a global variable representing a design rule characteristic; (b) program code for referencing the value of the global variable in a technology file; and (c) program code for utilizing the value of the global variable received from the technology file to perform the computer-aided design function.

BRIEF DESCRIPTION OF THE DRAWINGS

The above and other features, objects and advantages of the invention will be better understood by referring to the following detailed description in conjunction with the accompanying drawing in which.

DETAILED DESCRIPTION OF SPECIFIC EMBODIMENTS

Figure 1:
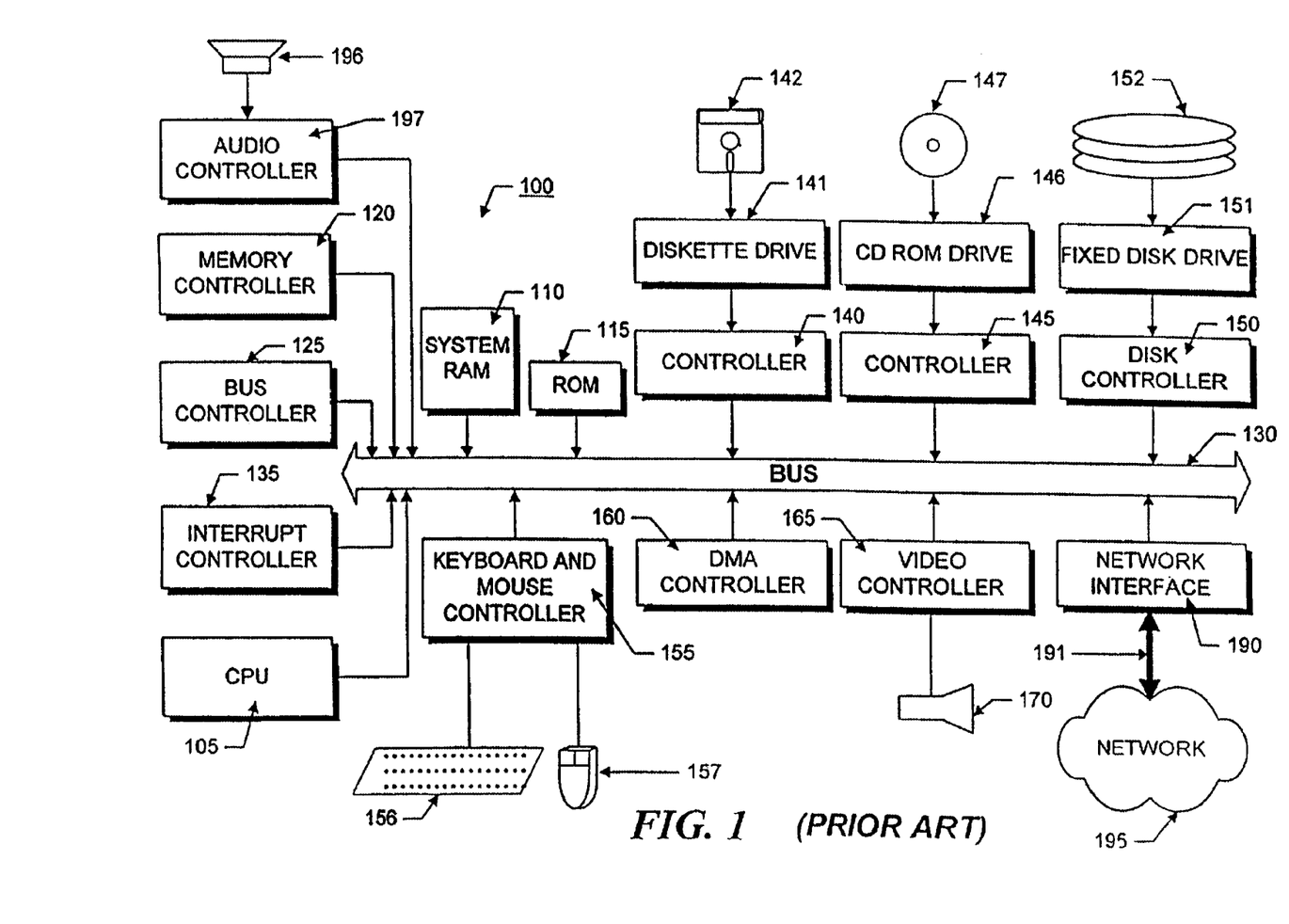
FIG. 1 is a block diagram of a computer system suitable for use with the present invention.

FIG. 1 illustrates the system architecture for a computer system 100 such as a Sun SparcStation 5 workstation, commercially available from Sun Microsystems of Palo Alto, Calif., on which the invention may be implemented. The exemplary computer system of FIG. 1 is for descriptive purposes only. Although the description may refer to terms commonly used in describing particular computer systems, such as an IBM Aptiva personal computer, the description and concepts equally apply to other systems, including systems having architectures dissimilar to FIG. 1.

Computer system 100 includes a central processing unit (CPU) 105, which may be implemented with a conventional microprocessor, a random access memory (RAM) 110 for temporary storage of information, and a read only memory (ROM) 115 for permanent storage of information. A memory controller 120 is provided for controlling RAM 110. A bus 130 interconnects the components of computer system 100. A bus controller 125 is provided for controlling bus 130. An interrupt controller 135 is used for receiving and processing various interrupt signals from the system components.

Mass storage may be provided by diskette 142, CD ROM 147, or hard drive 152. Data and software may be exchanged with computer system 100 via removable media such as diskette 142 and CD ROM 147. Diskette 142 is insertable into diskette drive 141 which is, in turn, connected to bus 30 by a controller 140. Similarly, CD ROM 147 is insertable into CD ROM drive 146 which is, in turn, connected to bus 130 by controller 145. Hard disk 152 is part of a fixed disk drive 151 which is connected to bus 130 by controller 150.

User input to computer system 100 may be provided by a number of devices. For example, a keyboard 156 and mouse 157 are connected to bus 130 by controller 155. An audio transducer 196, which may act as both a microphone and a speaker, is connected to bus 130 by audio controller 197, as illustrated. It will be obvious to those reasonably skilled in the art that other input devices, such as a pen and/or tabloid may be connected to bus 130 and an appropriate controller and software, as required. DMA controller 160 is provided for performing direct memory access to RAM 110. A visual display is generated by video controller 165 which controls video display 170. Computer system 100 also includes a network interface 190 which allows the system to be interconnected to a local area network (LAN) or a wide area network (WAN), schematically illustrated by bus 191 and network 195.

Operation of computer system 100 is generally controlled and coordinated by operating system software, such as the Solaris operating system, commercially available from Sun Microsystems, the UNIX® operating system, commercially available from The Open Group, Cambridge, Mass., the OS/2® operating system, commercially available from International Business Machines Corporation, Boca Raton, Fla., or the Windows NT operating system, commercially available from MicroSoft Corp., Redmond, Wash.

The operating system controls allocation of system resources and performs tasks such as processing scheduling, memory management, networking, and I/O services, among things. In particular, an operating system resident in system memory and running on CPU 105 coordinates the operation of the other elements of computer system 100.

CAD Environment

Figure 2:
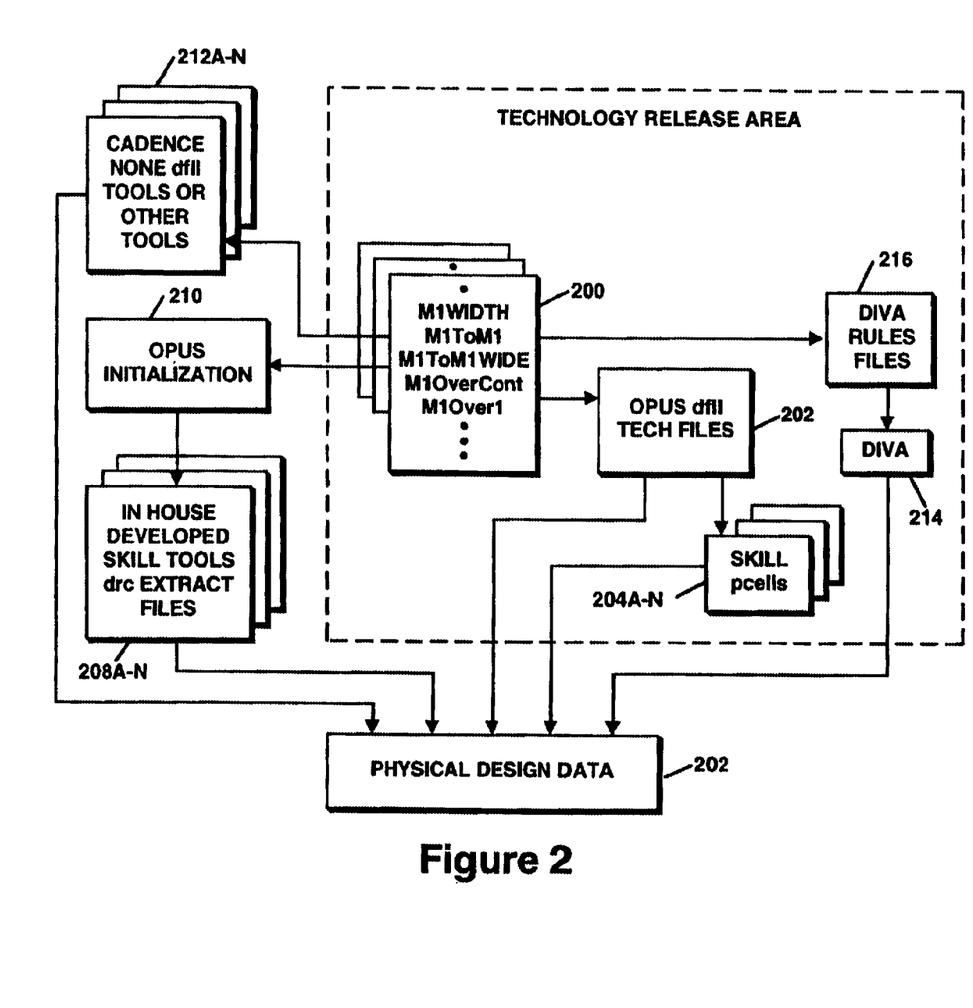
FIG. 2 is a conceptual block diagram of a CAD environment in which the present invention may be utilized.

FIG. 2 is a conceptual block diagram of a CAD environment in which the present invention is implemented. Specifically, the CAD environment comprises a global design rule definition file 200, a technology file 202, one or more programmable cells 204A–N, a physical design database 206, one or more custom CAD applications 208A–N, initialization programs 210 and other miscellaneous, non-native design applications 212A–N. Also shown is a verification tool 214 and verification tool rules file 216. The various components of the CAD design environment illustrated in FIG. 2 are described in greater detail hereinafter. The elements of the CAD environment illustrated in FIG. 2 collectively enable designers to physically model and design products, such as integrated circuits. Not all of the elements of the CAD environment described herein are necessary for the implementation of the present invention.

One or more of the elements within the CAD environment may be designed and/or operate according to the native language of the commercial CAD product environment, such as the OPUS CAD environment, as in the illustrative embodiment. Many programs and entities within the OPUS CAD environment are native to the SKILL programming language. The SKILL language is a high level programming language containing operators and primitives which are useful for designing CAD tools and applications. SKILL is the native language of most Opus tools including DIVA, the on line verification tool of Opus, commercially available from Cadence Design Systems, Inc. SKILL is used to develop custom CAD tools inside the Opus CAD environment, by Cadence products internally, and outside the Opus CAD environment by designers. If a CAD tool is a native SKILL tool variables can be passed directly through the tool interface. If a tool is a non-native SKILL tool, variables can not be accepted directly through the tool interface. Instead, a translation entity, such as described hereinafter, must be used to format the variables into the language of the non-native CAD tool.

Global Design Rules File

Figure 3:
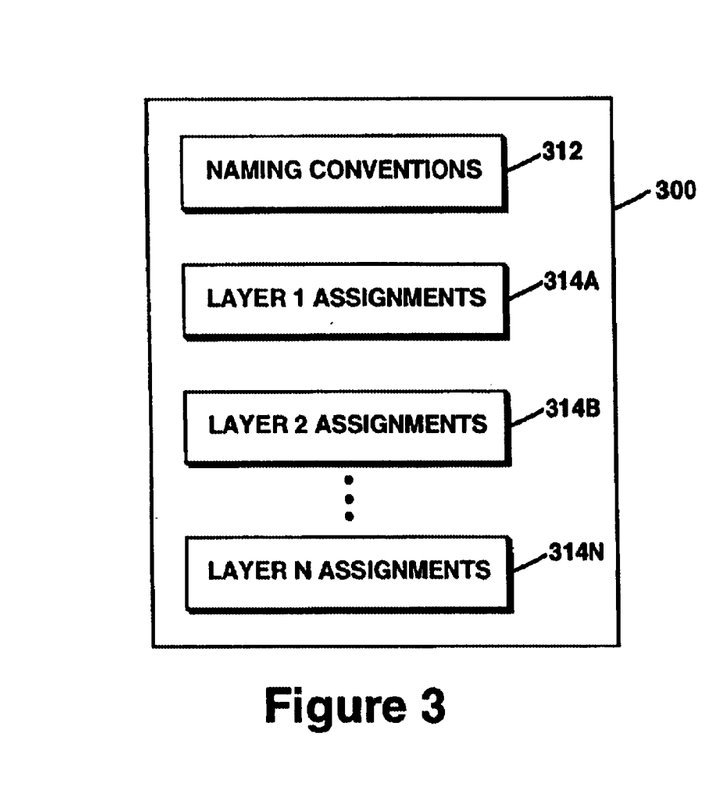
FIG. 3 is a conceptual diagram of a global design rule definition file containing the global variables for the design in accordance with the present invention.

In the illustrative embodiment, global design rule definition file 300 is created to define the relationship between a global variable and a design rule. This global design rule definition file 300 is used to bridge the design rule with the native SKILL CAD tools, so that the CAD design environment is synchronized with the design rules. The global design rule definition file 300 may be implemented as a text format SKILL program containing series of assignment statements to set the design rule values to variables, i.e. the design rules may be represented by a series of SKILL program statements.

A conceptual diagram of a global design rule definition file 300 is illustrated in FIG. 3. Global design rule definition file 300 comprises a Naming Convention section 312, which sets forth the variable name conventions. The variable names may be chosen to reflect the nature of the design rule so that user may easily understand the meaning of a global variable name. Global design rule definition file 300 further comprises at least one Assignment Section 314A, containing a series of assignment statements which set the design rule values to variables.

A sample global design rule definition file is set forth below. Each line of the Assignment Section of the global design rule definition file represents a design rule:

```
Naming Convention
/********
* Space         To
* Enclosure     Over
* Channel       Chnl
* Extension     Extn
* Internal      Int
* External      Ext
* Unrelated     Unrla
* Related       Rela
* Maximum       Max
* Minimum       Min
* Orthogonal    Orth
* Substrate     Sub
* Coincident    Coin
********/
Assignment Section
NwelWidth = 1.48                             ; 1.1 Width
NwelToNwel = 1.48                            ; 1.2 Space
NwelIntOverPActv = 0.50                      ; 1.3 Enclosure internal P+ Active
NwelExtToNActv = 0.50                        ; 1.4 Space external N+ Active
NwelOverActvNwelTap = 0.26                   ; 1.5 Enclosure Active N+ well tap
NwelToActvPSubTap = 0.74                     ; 1.6 Space to Active P+ substrate tap
NwelCoinNwelTap = 0.00                       ; 1.7.1 Coincident N+ well tap
NwellOverNwelTap = 0.50                      ; 1.7.2 Enclosure N+ well tap
NwelToPSubTap = 0.50                         ; 1.8 Space P+ substrate tap
M1Width = 0.36                               ; 5.1 Width
M1ToM1 = 0.34                                ; 5.2 Space
M1ToM1Wide = 0.72                            ; 5.3 Space for m1 width >= 7.0
M1OverContOrthToM1OverCont = 0.24            ; 5.4 Orthogonal space cont to cont, enclosure
M1OverCont = 0.10                            ; 5.5.1 cont side enclosure
M1OverContEnd = 0.10                         ; 5.5.2 cont end enclosure
M1WideOverCont = 0.30                        ; 5.5.3 Wide m1 (>7.0) enclosure of cont
M1MinArea = 0.52                             ; 5.6 Minimum area
M1DiagonalWidth = 0.46                       ; 5.7 Diagonal width
M1DiagonalToM1 = 0.44                        ; 5.8 Diagonal space
```

Where the physical layout of the circuit design includes more than one layer, the global design rule definition file 300 may comprise additional assignment sections 314B–N, having assignment statements which correspond to a different layer of the physical layout of the circuit design.

Technology File

Figure 4:
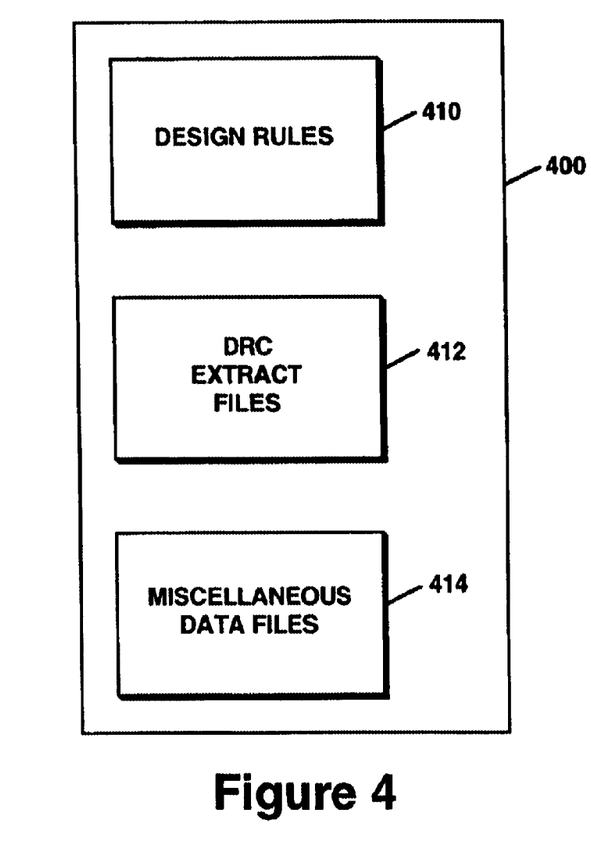
FIG. 4 is a conceptual diagram of a technology file containing the design rules for a particular CAD design.

The Technology file, referred to in the Cadence CAD environment as the "Opus dfII technology file," and referred to herein as "technology file", contains design technology information, including part of the design rules. The Opus dfII technology file is compiled to bind to each design library and is used by Opus internal tools to set certain default values to ensure that the circuit geometries are created correctly, as explained herein. A conceptual diagram of a technology file 400 is illustrated in FIG. 4.

Technology file 400 comprises design rule section 410, verification tool design rule file 412, and a miscellaneous data section 414. Section 410 contains data defining the design rules for the technology. Section 412 contains a design rule check (drcExtract) file. An extract file is a utility used to create devices based on physical design. In the drcExtract file global variables are used to create the drc rules. For example, part of a drcExtract file can be written as follows:

drc( nwel notch<NwelToNwel "min nwel space R1.2")
drc( nwel width<NwelWidth "min nwel width R1.1")
drc( nwel sep<NwelToNwel "min nwel space R1.2")
drc( nwel pmt enc<NwellntOverPActv "min nwell over act R1.3")
drc( nwel nmt sep<NwelExtToNActv "min nwell space to act R1.4")
drc( nwel ntap enc<NwelOverActvNwelTap "min nwell over ntap R1.5")
drc( nwel ptap sep<NwelToActvPSubTap "min nwell space to act R1.6")
rntap=geomAndNot( nwel tap)
drc( rntap width<NwellOverNwelTap "min nwell over tap R1.7.2")
drc( nwel tap sep<NwelToPSubTap "min nwell space to p+ tap R1.8")

Note that the drc rules do not contain actual values but instead reference the global variables defined in the global design rule definition file. Accordingly, a part of technology file indirectly contains design rules. Variables defined in the global design rule definition file 200 are not passed directly into a tool program, but are passed indirectly through the technology file since the values in the technology file for layer width and spacing, etc., are defined by the global variables from global design rule definition file 200. Not all the design rules are contained within technology file, particularly the design rules related to fabrication.

The technology file for Opus environment also contains display information, layer definition, and cellView definitions such as layout, schematic or symbol data. Such information is needed either to represent the design on the screen or for some simulation purposes and is typically unrelated to design rules. This information is maintained in section 414 of technology file 400.

In the illustrative embodiment, a programmable cell (pcell) is a SKILL program which uses design rule information to create geometries for different size of devices. A SKILL pcell is designed to rely on the technology file of a library. The pcell is created by a program which references certain design rules through the compiled technology file of the library.

Verification tool 214 and verification tool rules file 216 may be implemented with DIVA, a design rule check utility product commercially available from Cadence Design Systems, Inc., DIVA is used to verify a physical design data or derive the result of certain logical operations among geometries on the same or different layers of an integrated circuit design. In design flow development, it is common to write a DIVA rules file 216 to get resultant geometries from some logical operations on geometries of certain layers. Opus verification tools, such as DIVA, use their respective drc rules files to verify if a physical design meets each of the drc design rules. The drcExtract files 412, previously defined, are used as input command files for DIVA and instruct DIVA to perform certain tasks. A drcExtract file may be loaded as part of the technology file 400 or as needed. When only the drcExtract file 412 is loaded, only the drcExtract file is redefined. The remainder of the technology file 400 remains unchanged. Drc extract files may be kept as a separate file for easy maintenance.

CAD Tools

CAD tools typically perform a specific function related to a design. Such tools can be written in the CAD environment, e.g. SKILL, or in a non-native language. An example of a native SKILL CAD program (CreateSramVia) which uses the global variables to create vias is set forth as follows:

```
procedure(CreateSramVia(cv v_cv shape via out_file wide_f)
prog((box pt llx lly urx ury obj ccx ccy width height
    wide vw vv movx movy ebox xy obj_l)
box = shape ~>bBox
pt = car(box)
llx = xCoord(pt)
lly = yCoord(pt)
pt = cadr(box)
urx = xCoord(pt)
ury = yCoord(pt)
width = abs(urx - llx)
height = abs(ury - lly)
case(via
    ("v1"
        if(wide_f then
            movx = max(M1WideOverV1 M2WideOverV1)
            movy = max(M1WideOverV1 M2WideOverV1)
        else
            movx = max(M1OverV1 M2OverV1)
            movy = max(M1OverV1 M2OverV1)
        )
        vw = V1Width
        vv = V1ToV1
    )
    ("v2"
        if(wide_f then
            movx = max(M2WideOverV2 M3WideOverV2)
            movy = max(M2WideOverV2 M3WideOverV2)
        else
            movx = max(M2OverV2 M3OverV2)
            movy = max(M2OverV2 M3OverV2)
        )
        vw = V2Width
        vv = V2ToV2
    )
    ("v3"
        if(wide_f then
            movx = max(M3WideOverV3 M4WideOverV3)
            movy = max(M3WideOverV3 M4WideOverV3)
        else
            movx = max(M3OverV3 M4OverV3)
            movy = max(M3OverV3 M4OverV3)
        )
        vw = V3Width
        vv = V3ToV3
    )
)
ccx = llx + movx
while(ccx + vw < urx - movx + 0.000001
    ccy = lly + movy
    while(ccy + vw < ury - movy + 0.000001
        box = list(ccx:ccy ccx+vw:ccy+vw)
        xy = ccx+vw/2:ccy+vw/2
        ebox = ExpandABox(box vv-0.01)
            if(!dbGetOverlaps(cv ebox via 20) then
                obj = dbCreateInst(cv v_cv nil xy "R0")
                obj~>DrawMetal = nil
                dbReplaceProp(obj "SramPwr" "string" "yes")
            )
            ccy = ccy + vw + vv
    )
    ccx = ccx + vw + vv
)
if(shape~>objType == "polygon" then
    CleanViaInPolygon(cv via shape wide_f)
)
if(out_file then
    xy = nil
    if(shape~>objType == "polygon" then
        obj_1 = dbProduceOverlapInst(cv shape~>bBox)
        if(obj_1 then
            obj = car(obj_l)
            xy = FindBoxCenter(obj~>bBox)
        )
    else
        xy = FindBoxCenter(shape~>bBox)
    )
    if(xy then
        fprintf(out_file "%s %.2f %.2f\n"
```

```
            via xCoord(xy) yCoord(xy))
         )
      )
   )
)
```

In the above illustrated example of a native SKILL CAD program global variables from a global design rule file are utilized instead of the actual numeric values of the design rules. The above example is for illustrative purposes and should not be considered limiting.

Tools utilizing design rules other than Cadence dfII tools can also build their technology files dependent on the global design rule definition file 200. The global design rule definition file 300 is a plain text file, although in SKILL format in the illustrative embodiment. Accordingly, other CAD tools may easily reed and parse the global design rule definition file 200. This is particularly useful for custom designed CAD tools which are not native SKILL programs, such as nonnative design tools and applications 212A–N In the illustrative embodiment. As an example, an initialization program 210 (ParseSkillRules.il) uses global design rule definition file 200 as an Input file and generates two output files used by the technology file 202 and Calibre, a verification tool commercially available from Mentor graphics Inc., respectively. Specifically, as for the first output file, ParseSkillRules.il reads and parses global design rule definition file 300 and generates the first output file In a temporary directory. ParseSkillRules.il then transparently loads the first output file to the technology file 202 (Opus 4.4 technology file) to create the Illusion for the non-SKILL CAD tool user that the global design rule definition file 300 (SkillDesignRules.il) was referenced directly. The second output file is included in all the Calibre rule definition files to define the variables therein. The following is a code listing of the ParseSkillRules.il program which performs the above-identified process:

```
procedure(ParseSkillRules( )
   prog((file in_file filename out_file line s_1 filename1 out_file1
      comment c_1)
   file = sprintf(nil "%s/SkillDesignRules.il" DFII_TECH_DIR)
   in_file = infile(file)
   if(!in_file then
      printf("ERROR: Unable to open %s\n" file)
      return(nil)
   )
   filename = sprintf(nil "%s/tech_dir/techParams.tf" DFII_TECH_DIR)
   out_file = outfile(filename)
   if(!out_file then
      printf("ERROR: Unable to open %s\n" filename)
      return(nil)
   )
   filename1 = sprintf(nil "%s/tech_dir/techParams.calibre"
      DFII_TECH_DIR)
   out_file1 = outfile(filename1)
   if(!out_file1 then
      printf("ERROR: Unable to open %s\n" filename1)
      return(nil)
   )
   fprintf(out_file "techParams(\n")
   while(gets(line in_file)
      s_1 = parseString(line)
      if(nth(1 s_1) == "=" then
         fprintf(out_file " (%s %s)\n" nth(0 s_1) nth(2 s_1))
         comment = index(line ";")
         if(comment then
            comment = substring(comment 2 strlen(comment)-1)
```

```
            c_1 = parseString(comment)
            comment = buildString(c_1)
         else
            comment = " "
         )
         fprintf(out_file1 "VARIABLE %s %s // R%s\n"
            nth(0 s_1) nth(2 s_1) comment)
      )
   )
   fprintf(out_file ")\n")
   close(in_file)
   close(out_file)
   close(out_file1)
   load(filename)
   )
)
ParseSkillRules( )
```

The rules definition file for Calibre, including the file generated by the above program, is an example of a non-SKILL tool 212A–N. For the other CAD tools, especially for new generation tools, a script file can be written to parse the SkillDesignRules.il in a manner similar to the above program. The following is an excerpt from the second output file to be included in the Calibre rule definition file:

VARIABLE NwelWidth 1.48 // R1.1 Width
VARIABLE NwelToNwel 1.48 // R1.2 Space
VARIABLE NwellntOverPActv 0.50 // R1.3 Enclosure internal P+ Active
VARIABLE NwelExtToNActv 0.50 // R1.4 Space external N+ Active
VARIABLE NwelOverActvNwelTap 0.26 // R1.5 Enclosure Active N+ well tap
VARIABLE NwelToActvPSubTap 0.74 // R1.6 Space to Active P+ substrate tap
VARIABLE NwelCoinNwelTap 0.00 // R1.7.1 Coincident N+ well tap
VARIABLE NwellOverNwelTap 0.50 // R1.7.2 Enclosure N+ well tap
VARIABLE NwelToPSubTap 0.50 // R1.8 Space P+ substrate tap If techParams.calibre is the file name, in the Calibre rule definition file, the following line will cause all the variables to be defined:

INCLUDE $DFII_TECH_DIR/tech_dir/techParams.calibre // define rule variable

The physical design database 206 stores the data which represents the physical characteristics of the designed entity, e.g. the integrated circuit or a portion thereof. The physical design data in database 206 is organized into one or more libraries. Each library, in turn, may contain one or more cells. Each cell, in turn, may contain one or more views. The physical design is known as a cellView layout and serves as the atomic element from which designer's work on a design. Each library within database may have a special technology file associated therewith. Alternatively, several libraries may share the same technology file. Database 206 may be implemented with any number of commercially available database products. The structure and function of physical design database 206 is well within the scope of those reasonably skilled in the arts and will not be described in greater detail herein.

Process Description

Figure 5A:
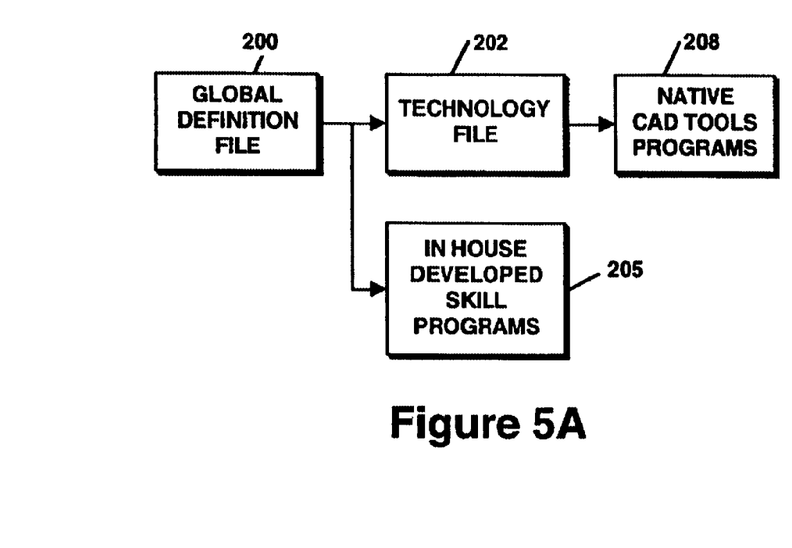
FIGS. 5A–B are conceptual diagrams illustrating the relationship therebetween the various elements of the CAD environment in accordance with the present invention.

In FIG. 5A, the relationship between global design rule definition file 200, technology file 202, native CAD tool programs 208 and custom developed SKILL CAD tools 205, is illustrated with the processes with which relate these files and programs together, shown conceptually as arrows. Custom developed SKILL CAD tools, typically developed in-house, may access the values of the global variables in file 200 directly. Other native CAD tools 208 reference the global variables within file 200 through technology file 202 in a manner as described herein.

Figure 5B:
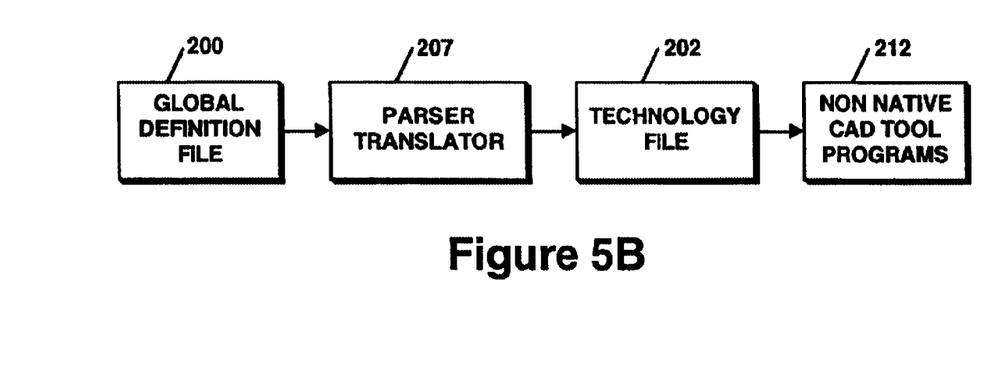

FIG. 5B illustrates the relationship between global design rule definition file 200, technology file 202, translator program 207 and a non-native CAD tool 212, with the relationships between the respective files and tools illustrated conceptually as arrows. If a non-native technology file 202 can not accept a SKILL variable directly, a program 207 translates the global design rule definition file 200 into the non-native CAD tool technology file 202 in the manner previously described to supply the non-native CAD tools 212 or other application programs with the appropriate design rule data.

Figure 6:
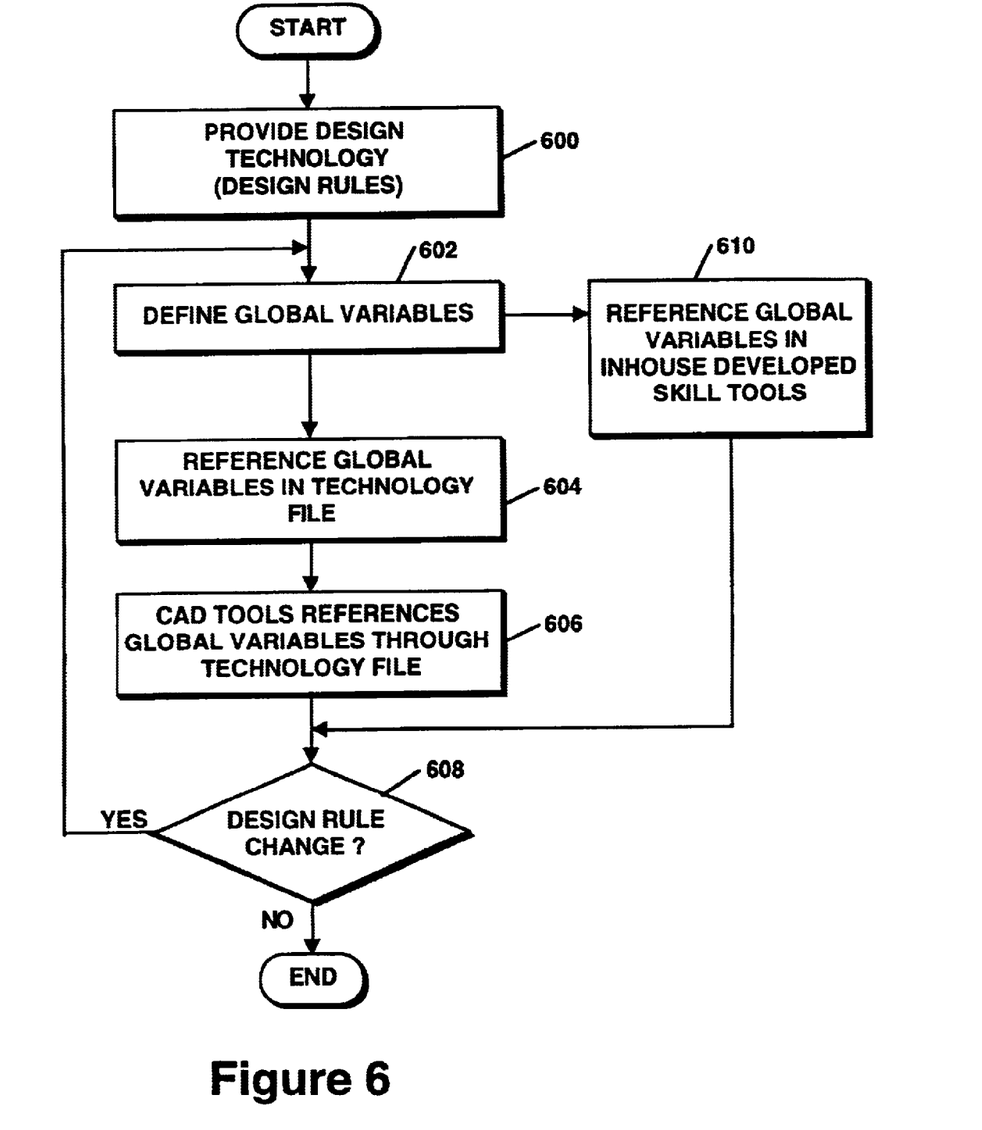
FIG. 6 is a flowchart illustrating the method of ensuring consistency of design rule application among a plurality of CAD tools in accordance with the present invention.

FIG. 6 illustrates a flow chart of a process for ensuring consistency of designable applications in a CAD environment in accordance with the present invention. First, a set of design rules defining the physical limitations of the technology with which the design is to be implemented is provided, as illustrated by procedural step 600 of FIG. 6. Typically, the design rules will be defined in a file or files which define specific physical quantities for the physical characteristics of a particular fabrication technology. For example, the width or depth of a path of metal on a substrate. It will be appreciated that such design rules will vary greatly according to the technology used to implement a device. Next, in accordance with the invention, a global design rule definition file 200 is defined in which specific values for design rules of a particular technology are assigned to a global variable, as described with reference to section 314 of FIG. 3, and as illustrated in procedural step 602. If a CAD tool is native, i.e. developed in the same language as the global variables are defined in the global design rule definition file 200, the CAD tool accesses the values of the global variables in file 200 directly, as illustrated in step 610, without further need for translation or compilation of a technology file 202. In this case when a global variable is redefined in the global design rule definition file 200 the native CAD tools will directly access the updated variable.

All other CAD tools utilize the technology file to indirectly reference the global variables of file 200. Next, the global variables defined in the global design rule definition file 200 are referenced by the technology file 202, as illustrated in procedural step 604. Loading of the global design rule definition file into the technology file occurs through a process of linking, compilation and or translating, as described hereafter. The technology file is made available for compilation or binding to one or more CAD design tools which contain program statements including one or more of the global variables.

In a CAD design environment, such as one which uses Opus 4.3 version, before any function is loaded, the global definition file 200 which contains SKILL assignment statements is loaded into the technology file using a utility file, so the variables are available for the whole environment, i. e. the variables can be used as a value. An exemplary utility file userTFModule ( ) listed below contains commands to compile the technology file 202. When the userTFModule ( ) is executed, the technology file 202 is compiled. This process results in loading of the global variables from file 200 into the technology file 202.

```
procedure(userTFModule( )
  let((file)
    file = sprintf(nil "%s/SkillDesignRules.il" DFII_TECH_DIR)
    load(file)
    file = sprintf(nil "%s/tech_dir/tfcDefineLayerPurpose.tf"
        DFII_TECH_DIR)
    load(file)
    file = sprintf(nil "%s/tech_dir/tfcDefineDisplay_display.tf"
        DFII_TECH_DIR)
    load(file)
    file = sprintf(nil "%s/tech_dir/tfcDefineView.tf" DFII_TECH_DIR)
    load(file)
    file = springf(nil "%s/tech_dir/tfcDefineLayerProp.tf"
        DFII_TECH_DIR)
    load(file)
    file sprintf(nil "%s/tech_dir/tfcDefineDisplay_versatecc.tf"
        DFII_TECH_DIR)
    load(file)
    file = sprintf(nil "%s/tech_dir/drcExtractRules.tf"
        DFII_TECH_DIR)
    load(file)
    file = sprintf(nil "%s/tech_dir/lvsRules.tf" DFII_TECH_DIR)
    load(file)
    file = sprintf(nil "%s/tech_dir/CreateSymbolicDevice.tf"
        DFII_TECH_DIR)
    load(file)
    )
)
```

Alternatively, in a CAD environment, such as one which uses Opus 4.4, a user may specify parameters, e.g. techParameters, which can be used in the technology file 202 to translate the global design rule definition file into a non-native language format. The following exemplary utility file contains commands to compile the technology file 202, as set forth below:

```
controls(
    let((file)
        file = sprintf(nil "%s/tech_dir/ParseSkillRules.il"
            DFII_TECH_DIR)
        load(file)
        )
)
layerDefinitions(
    let((file)
        file = sprintf(nil "%s/tech_dir/layDefs_purpose.tf"
            DFII_TECH_DIR)
        load(file)
        file = sprintf(nil "%s/tech_dir/layDefs_layers.tf"
            DFII_TECH_DIR)
        load(file)
        file = sprintf(nil "%s/tech_dir/layDefs_ppPriorities.tf"
            DFII_TECH_DIR)
        load(file)
        file = sprintf(nil "%s/tech_dir/layDefs_displays.tf"
            DFII_TECH_DIR)
        load(file)
        file = sprintf(nil "%s/tech_dir/layDefs_properties.tf"
            DFII_TECH_DIR)
        load(file)
        )
) ;layerDefinitions
physicalRules(
    let((file)
        file = sprintf(nil "%s/tech_dir/physicalRules.tf"
            DFII_TECH_DIR)
        load(file)
        )
) ;physicalRules
layerRules(
    let((file)
        file = sprintf(nil "%s/tech_dir/layerRules.tf" DFII_TECH_DIR)
        load(file)
```

```
)
) ;layerRules
devices(
    tcCreateCDSDeviceClass( )
    let((file)
        file = sprintf(nil "%s/tech_dir/symContactDevice.tf"
        DFII_TECH_DIR)
        load(file)
    )
) ; devices
```

In the technology file 202, a command to execute SKILL program ParseSkillRules is inserted so as to execute itself right after loading. ParseSkillRules parses each line in the global design rule definition file 200 into the techParameter format, i.e. the format of the non-native CAD tool. For example, if the technology file 202 contains the assignments as set forth below:
V1Width=0.32; 6.1 Size
V1ToV1=0.52; 6.2 Space
M1OverV1=0.10; 6.3.1 m1 enclosure(in straight lead)
M1WideOverV1=0.30; 6.3.2 Wide m1(>7.0) enclosure
V1ToCont=0.0; 6.4 Space to cont
it will be translated to:
techParam(
(V1Width0.32)
(V1ToV1 0.52)
(M1OverV1 0.10)
(M1WideOverV1 0.30)
(V1ToCont0.0)
Variables can then be obtained by a non-native CAD tool by executing the techParam( ) function. Below are several lines from an exemplary non-native CAD tool physicalRules.tf which uses the techParam( ) function to reference the values in file 200.

```
orderedSpacingRules(
;(rule              layer1   layer2   value)
;(----              ------   ------   -----)
(minEnclosure       m1       v1       techParam("M1OverV1"))
(minWideEnclosure   m1       v1       techParam("M1WideOverV1"))
(minEnclosure       m2       v1       techParam("M2OverV1"))
(minWideEnclosure   m2       v1       techParam("M2WideOverV1"))
)
```

In the above example, the m1 over v1 property "minEnclosure" has been set to M1OverV1 which is the indirect from the global design rule definition file 200. This process is illustrated by step 606.

The CAD tools are next used in their intended manner to design an entity, e.g., an integrated circuit, in accordance with the design rules for the technology. If a change in the design rules occurs, such as a decision to implement a particular design in a different technology, as illustrated by decisional step 608, the definition of the global variables related to the design rules is redefined in a manner similar to step 602. In this manner, the design rules need only be changed in the global design rule definition file 200. Following the procedures previously outlined with regard to step 604–608, appropriate updating of the global design rule definition file 200 will result in synchronization of appropriate changes throughout the technology file and CAD tools within the design environment merely through referencing the current global variable either through the global design rule definition file or the technology file, as described herein.

It is contemplated in the invention that each technology release is accompanied with its own technology file 202 and global design rule definition file 200 so the same tools can work on different technology releases.

Thus the whole design environment is synchronized with the design rules. In the event one of the design rules changes, the user maintaining the technology file in most cases need only modify the global design rule definition file 200 for the rest of the CAD environment to utilize the design rule change.

A software implementation of the above described embodiment(s) may comprise a series of computer instructions either fixed on a tangible medium, such as a computer readable media, e.g. diskette 142, CD-ROM 147, ROM 115, or fixed disk 152 of FIG. 1, or transmittable to a computer system, via a modem or other interface device, such as network interface 190 connected to the network 195 over a medium 191. Medium 191 can be either a tangible medium, including but not limited to optical or analog communications lines, or may be implemented with wireless techniques, including but not limited to microwave, infrared or other transmission techniques. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, preloaded with a computer system, e.g., on system ROM or fixed disk, or distributed from a server or electronic bulletin board over a network, e.g., the Internet or World Wide Web.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations which utilize a combination of hardware logic and software logic to achieve the same results.

What is claimed is:

1. In a computer-aided design environment, a method for ensuring consistency of design rule application among a plurality of CAD tool programs, each design rule defining a design characteristic, the method comprising:

(a) creating a global design rule definition file as a plain text file in SKILL format, the global design rule definition file including at least one global variable having a design rule characteristic assigned thereto;

(b) providing a technology file containing a reference to the global variable;

(c) initializing one of the CAD tool programs which utilizes the global variable with the technology file reference to the global variable; and (d) determining whether any modifications have occurred to the design rule and redefining the global variable in the global design rule definition file in accordance with modifications to the design rule and conforming the CAD tool program to modifications in the design rule.

2. The method of claim 1 wherein the CAD tool program and the global design rule definition file are written in the same language.

3. The method of claim 1 wherein the CAD tool program and the global design rule definition file are not written in the same language.

4. The method of claim 3 wherein (c) further comprises:
(c.1) translating the global design rule definition file into the language of the CAD tool program.

5. In a computer-aided design system having at least one memory and adhering to a plurality of design rules, each design rule defining a design characteristic, a system for ensuring consistency of design rule application among a plurality of CAD tool programs, the system having a memory and comprising:
A. a global design rule definition file as a plain text file in SKILL format, the global design rule definition file stored in the memory and including at least one global variable having a design rule characteristic assigned thereto;
B. a technology file stored in the memory and containing a reference to the global variable;
C. at least one CAD tool program stored in the memory and which utilizes the global variable; and
D. means for ensuring that the CAD tool program utilizes the current design rule changes.

6. The system of claim 5 wherein the means for ensuring comprises: means for initializing the CAD tool program which utilizes the global variable with the technology file reference to the global variable.

7. The system of claim 5 wherein the CAD tool program and the global design rule definition file are written in the same language.

8. The system of claim 5 wherein the CAD tool program and the global design rule definition file are not written in the same language.

9. The system of claim 8 wherein the system further comprises program code configured to translate the global design rule definition file into the language of the CAD tool program.

10. A computer program product for use with a computer system, the computer system capable of executing computer-aided design programs, the computer program product comprising a computer usable medium having program code embodied in the medium, the program code comprising:
(a) program code for defining a global design rule definition file as a plain text file in SKILL format, the global design rule definition file having at least one global variable having a design rule characteristic assigned thereto;
(b) program code defining a technology file containing a reference to the global variable;
(c) program code for initializing one of the CAD tool programs which utilizes the global variable with the technology file reference to the global variable; and
(d) program code for redefining the global variable in the CAD tool program in accordance with modifications to the design rule characteristic assigned to the global variable in the global design rule definition file.

11. In a computer-aided design system having a memory, a method for ensuring consistency of design rule application among a plurality of CAD tool programs, each design rule defining a design characteristic, the method comprising:
(a) creating a global design rule definition file as a plain text file in SKILL format in the memory, the global design rule definition file including at least one global variable having a design rule characteristic assigned thereto;
(b) providing at least one program statements within one of the CAD tool programs which references a global variable within the global design rule definition file; and
(c) redefining the global variable in the global design rule definition file in accordance with modifications to the design rule characteristic and conforming the CAD tool program to modifications in the design rule characteristic.

* * * * *